United States Patent
Iwata

Patent Number: 5,670,789
Date of Patent: Sep. 23, 1997

[54] SEMICONDUCTOR LIGHT-EMITTING DEVICE WITH QUANTUM WELL STRUCTURE

[75] Inventor: Hiroshi Iwata, Tokyo, Japan

[73] Assignee: NEC Corporation, Tokyo, Japan

[21] Appl. No.: 569,287

[22] Filed: Dec. 8, 1995

[30] Foreign Application Priority Data

Dec. 8, 1994 [JP] Japan ................................. 6-331111

[51] Int. Cl.$^6$ ............... H01L 29/06; H01L 31/0328; H01L 31/0336; H01L 31/072
[52] U.S. Cl. ............... 257/13; 257/17; 257/22; 257/23; 257/96; 257/97; 372/45; 372/46
[58] Field of Search .................. 257/85, 94, 96, 257/97, 13, 15, 17, 22, 23; 372/45, 46, 47

[56] References Cited

U.S. PATENT DOCUMENTS

| | | |
|---|---|---|
| 4,918,496 | 4/1990 | Matsushima et al. |
| 5,237,581 | 8/1993 | Asada et al. ................. 372/45 |
| 5,276,698 | 1/1994 | Yoshida et al. ............... 372/45 |
| 5,331,655 | 7/1994 | Harder et al. ................ 372/45 |
| 5,475,700 | 12/1995 | Iwata ........................ 372/45 |
| 5,481,558 | 1/1996 | Ikeda et al. ................. 372/45 |

OTHER PUBLICATIONS

S. Itoh et al., "ZnCdSe/ZnSSe/ZnMgSSe SCH Laser Diode with a GaAs Buffer Layer", *Jpn. J. of Appl. Phys.*, vol. 33, Part 2, No. 7A, Jul. 1, 1994, pp. L938–L940.

*Primary Examiner*—Ngân V. Ngô
*Attorney, Agent, or Firm*—Sughrue, Mion, Zinn, Macpeak, and Seas

[57] ABSTRACT

A semiconductor light-emitting device that enables to realize a satisfactory carrier confinement effect to be capable of stable operation at room temperature. This device includes a QW layer and p- and n-barrier layers placed at each side of the QW layer. The QW layer has an energy level $E_{va}$ at the top of the valence band and an energy level $E_{ca}$ at the bottom of the conduction band. The p-barrier layer has an energy level $E_{vpb}$ at the top of the valence band and an energy level $E_{cpb}$ at the bottom of the conduction band. The n-barrier layer has an energy level $E_{vnb}$ at the top of the valence band and an energy level $E_{cnb}$ at the bottom of the conduction band. The energy levels $E_{va}$, $E_{vpb}$ and $E_{vnb}$ at the top of the valence band satisfy the relationship of $E_{va} > E_{vpb} > E_{vnb}$. The energy levels $E_{ca}$, $E_{cpb}$ and $E_{cnb}$ at the bottom of the conduction band satisfy the relationship of $E_{ca} < E_{vnb} < E_{vpb}$. Electrons injected into the QW layer through the n-barrier layer and holes injected into the QW layer through the p-barrier layer are recombined with each other to emit light therefrom.

10 Claims, 4 Drawing Sheets

SEMICONDUCTOR LIGHT-EMITTING DEVICE WITH QUANTUM WELL STRUCTURE

BACKGROUND OF THE INVENTION

1. Field of the Invention

The present invention relates to a semiconductor light-emitting device and more particularly, to a semiconductor light-emitting device such as a laser diode and a light-emitting diode with a quantum well (QW) structure or structures, which is capable of stable operation at room temperature.

2. Description of the Prior Art

A conventional II–VI compound semiconductor laser diode having the separate confinement heterostructure (SCH) was disclosed in Japanese Journal of Applied Physics Vol. 33, pp. L938–L940, July, 1994, which enables the laser oscillation at room temperature.

This conventional laser diode contains a ZnCdSe QW active layer, n- and p-type ZnSSe guiding layers disposed at each side of the active layer to be contacted therewith, and n- and p-type ZnMgSSe cladding layers disposed adjacent to the respective n- and p-type guiding layers. Thus, the ZnCdSe active layer is sandwiched by the n- and p-type ZnSSe guiding layers. The n-type ZnMgSSe cladding layer is contacted with the outer side of the n-type guiding layer, and the p-type ZnMgSSe cladding layer is contacted with the outer side of the p-type guiding layer.

With the above conventional laser diode, however, if the Mg mole fraction of the p-type ZnMgSSe cladding layer is increased up to 10% or more, the p-type ZnMgSSe cladding layer becomes highly resistive. As a result, the Mg mole fraction is less than 10%, and therefore a problem that a satisfactory carrier confinement effect cannot be obtained by the p-type cladding layer.

Next, in general, the heterostructure of the compound semiconductor materials has an energy band lineup termed the "type 1" or "straddling type" and the "type 2" or "staggered type". Typically, heterojunctions of II–VI compound semiconductors including Mg or III–V compound semiconductors such as ZnSSe/ZnMgSSe, GaAs/AlGaAs or the like are of the type 1. Heterojunctions of II–VI compound semiconductors including no Mg such as ZnCdSSe, ZnCdSeTe or the like are of the type 2.

With the type-1 (straddling type) heterostructure made of first and second semiconductor layers, the second semiconductor layer has the top of the valence band higher than that of the first semiconductor layer, and has the bottom of the conduction band lower than that of the first semiconductor layer. Therefore, the energy band gap of the first semiconductor layer is greater than that of the second semiconductor layer.

With the type-2 (staggered type) heterostructure made of first and second semiconductor layers, the second semiconductor layer has the top of the valence band higher than that of the first semiconductor layer, and has the bottom of the conduction band higher than that of the first semiconductor layer. The energy band gap of the first semiconductor layer may be greater or less than or equal to that of the second semiconductor layer.

The II–VI compound semiconductor heterostructure containing no magnesium (Mg) typically has the energy band lineup of the type-2 or staggered type and therefore, a QW structure with a high recombination rate of electrons and holes cannot be provided for lattice-matched semiconductor materials. As a result, a strained QW structure made of semiconductor materials having different lattice constants needs to be employed to obtain a high electron-hole recombination rate.

However, only a limited or finite strain can be introduced into the QW structure. Therefore, a problem that a satisfactory carrier confinement effect cannot be provided by the strain introduction into the QW structure.

Thus, with the conventional II–VI laser diodes, neither the cladding layers nor the strained QW structure can realize the satisfactory carrier confinement effect, and as a result, problems of a large threshold current for oscillation and of a short lifetime at room temperature occur.

SUMMARY OF THE INVENTION

Accordingly, an object of the present invention is to provide a semiconductor light-emitting device that enables to realize a satisfactory carrier confinement effect.

Another object of the present invention is to provide a semiconductor light-emitting device capable of stable operation at room temperature.

Still another object of the present invention is to provide a semiconductor light-emitting device that enables to realize a practical blue-green laser diode or light-emitting diode.

These objects together with others not specifically mentioned will become clear to those skilled in the art from the following description.

A semi-conductor light-emitting device according to the present invention includes a QW layer and p- and n-type barrier layers placed at each side of the QW layer.

The QW layer has an energy level $E_{va}$ at the top of the valence band and an energy level $E_{ca}$ at the bottom of the conduction band. The p-type barrier layer has an energy level $E_{vpb}$ at the top of the valence band and an energy level $E_{cpb}$ at the bottom of the conduction band. The n-type barrier layer has an energy level $E_{vnb}$ at the top of the valence band and an energy level $E_{cnb}$ at the bottom of the conduction band.

The energy levels $E_{va}$, $E_{vpb}$ and $E_{vnb}$ at the top of the valence band satisfy the relationship of $E_{va} > E_{vpb} > E_{vnb}$. The energy levels $E_{ca}$, $E_{cpb}$ and $E_{cnb}$ at the bottom of the conduction band satisfy the relationship of $E_{ca} < E_{cnb} < E_{cpb}$.

Electrons are injected into the QW layer through the n-type barrier layer and holes are injected into the QW layer through the p-type barrier layer. The electrons and holes thus injected into the QW layer are recombined with each other, emitting light from the QW layer.

With the semiconductor light-emitting device according to the present invention, since the energy levels $E_{ca}$, $E_{cpb}$ and $E_{cnb}$ at the bottom of the conduction band satisfy the relationship of $E_{ca} < E_{cnb} < E_{cpb}$, the band offset of the conduction band between the QW layer and the p-type barrier layer is greater than that between the QW layer and the n-type barrier layer. Therefore, the electrons injected into the QW layer through the n-type barrier layer are difficult to diffuse into the p-type barrier layer.

Similarly, since the energy levels $E_{va}$, $E_{vpb}$ and $E_{vnb}$ at the top of the valence band satisfy the relationship of $E_{va} > E_{vpb} > E_{vnb}$, the band offset of the valence band between the QW layer and the n-barrier layer is greater than that between the QW layer and the n-type barrier layer. Therefore, the holes injected into the QW layer through the p-type barrier layer are difficult to diffuse into the n-type barrier layer.

As a result, both of the injected electrons and holes tend to be confined within the QW layer to be efficiently recombined with each other, emitting light from the QW layer. This means that a satisfactory carrier confinement effect can be realized.

Also, because a satisfactory carrier confinement effect can be realized, the semiconductor light-emitting device is capable of stable operation at room temperature, which leads to realization of a practical blue-green laser diode or light-emitting diode.

In a preferred embodiment, p- and n-type cladding layers are additionally provided. The p-type cladding layer is placed on the side of p-type barrier layer. The n-type cladding layer is placed on the side of n-type barrier layer. These cladding layers enhance the carrier confinement effect.

In another preferred embodiment, p- and n-type optical guiding layers are additionally provided. The p-type optical guiding layer is placed on the side of p-type barrier layer. The n-type optical guiding layer is placed on the side of n-type barrier layer. These optical guiding layers enhance the optical confinement function.

In still another preferred embodiment, the QW layer constitutes a multiple QW structure. This reduces the threshold current.

In a further preferred embodiment, a reflection layer is additionally placed on the side of the p- or n-type barrier layer to reflect the light emitted from the QW layer. This is effective for a light-emitting diode.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Figure 1:
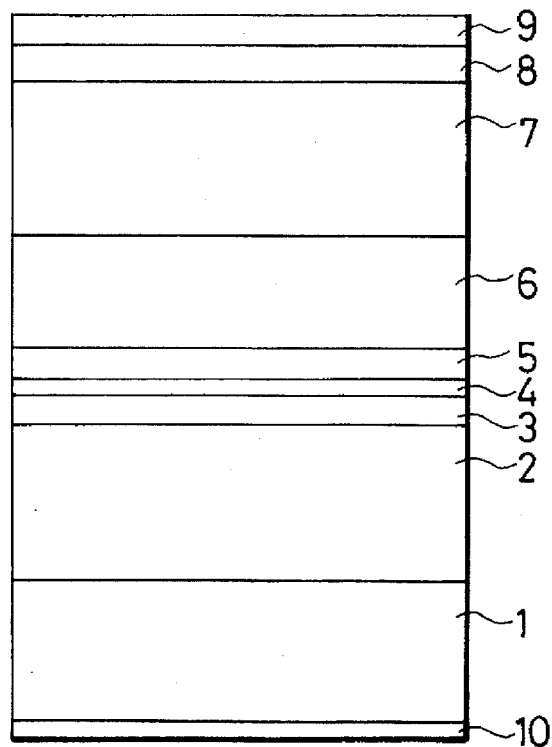
FIG. 1 is a schematic cross-section of a semiconductor light-emitting device according to a first embodiment of the invention.

Preferred embodiments of the present invention will be described bellow while referring to the drawings attached.

FIRST EMBODIMENT

Figure 2:
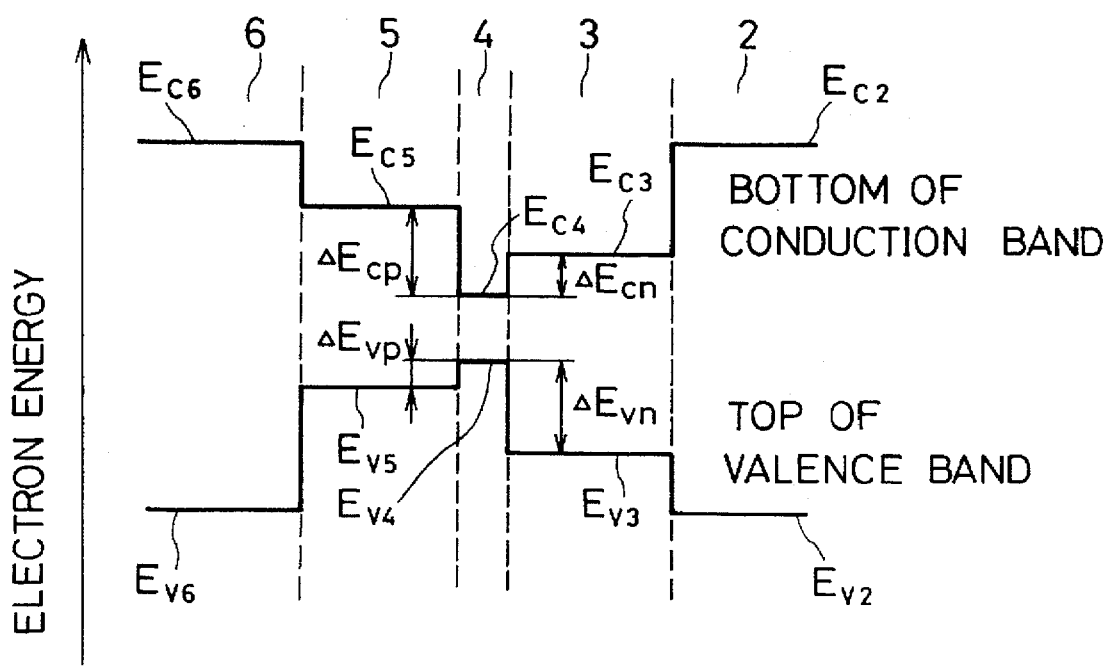
FIG. 2 is a partial energy band diagram of the semiconductor light-emitting device according to the first embodiment.

A II–VI compound semiconductor laser diode according to a first embodiment of the invention is shown in FIGS. 1 and 2.

As shown in FIG. 1, an n-type cladding layer 2 with a thickness of 1 µm is formed on a first main surface of an n-type GaAs substrate 1. The cladding layer 2 is made of n-type $Zn_{0.91}MG_{0.09}S_{0.16}Se_{0.84}$ doped with chlorine (Cl) the dopant concentration of which is $5\times10^{17}$ atoms/cm$^3$.

On the n-type cladding layer 2, an n-type barrier layer 3 with a thickness of 100 nm is formed. The barrier layer 3 is made of $Zn_{0.9}Cd_{0.1}S_{0.22}Se_{0.78}$ doped with Cl the dopant concentration of which is $5\times10^{17}$ atoms/cm$^3$.

On the n-type barrier layer 3, a strained QW layer 4 with a thickness of 7 nm is formed. The layer 4 is made of undoped $Zn_{0.75}Cd_{0.25}Se$.

On the QW layer 4, a p-type barrier layer 5 with a thickness of 100 nm is formed. The barrier layer 5 is made of $ZnS_{0.06}Se_{0.94}$ doped with nitrogen (N) the dopant concentration of which is $4\times10^{17}$ atoms/cm$^3$.

On the p-type barrier layer 5, a p-type cladding layer 6 with a thickness of 0.5 µm is formed. The cladding layer 6 is made of $Zn_{0.91}Mg_{0.09}S_{0.16}Se_{0.84}$ doped with N the dopant concentration of which is $1\times10^{17}$ atoms/cm$^3$.

On the p-type cladding layer 6, a p-type cladding layer 7 with a thickness of 0.6 µm is formed. The cladding layer 7 is made of $ZnS_{0.06}Se_{0.94}$ doped with N the dopant concentration of which is $4\times10^{17}$ atoms/cm$^3$.

On the p-type cladding layer 7, a p-type contact layer 8 with a thickness of 100 nm is formed. The contact layer 8 is made of ZnSe doped with N the dopant concentration of which is $1\times10^{18}$ atoms/cm$^3$.

A p-side electrode 9 made of gold (Au) is formed on the p-type contact layer 8. The p-side electrode 9 covers the entire surface of the layer 8.

An n-side electrode 10 made of Au is formed on the second main surface of the substrate 1 opposite to the first main surface. The n-side electrode 10 covers the entire second main surface.

All of the above semiconductor layers 2, 3, 5, 6, 7 and 8 except for the QW layer 4 are lattice-matched with the substrate 1.

With the above semiconductor laser diode according to the first embodiment, the strained QW layer 4 and the n- and p-type barrier layers 3 and 5 constitute a strained QW structure. The n- and p-type cladding layers 2 and 6 have a function of confining both of carriers (i.e., electrons and holes) and light within the QW structure.

The p-type cladding layer 7 has a function of reducing the electric resistance of the diode. The p-type contact layer 8 has a function of reducing the electric contact resistance of the p-side electrode 9 with the p-type cladding layer 7.

This semiconductor laser diode can emit light in blue and green spectral regions, i.e., this is a so-called blue-green laser diode.

The II–VI compound semiconductor laser diode according to the first embodiment is fabricated by the following process sequence:

First, on the first main surface of the n-type GaAs substrate 1, the n-type cladding layer 2, the n-type barrier layer 3, the QW layer 4, the p-type barrier layer 5, the p-type cladding layer 6, the p-type cladding layer 7 and the p-type contact layer 8 are successively and epitaxially grown by a molecular beam epitaxy (MBE) method.

Next, Au is deposited to cover the exposed top surface of the p-type contact layer 8 by an evaporation method, forming the p-side electrode 9 thereon. Also, Au is deposited on the exposed second main surface of the substrate 1, forming the n-side electrode 10 thereon.

Finally, a cavity is formed by cleavage. Thus, the laser diode shown in FIG. 1 is obtained.

FIG. 2 shows the energy band diagram of the laser diode of FIG. 1. In FIG. 2, the n-type cladding layer 2 has an energy level $E_{v2}$ at the top of the valence band, and has an energy level $E_{c2}$ at the bottom of the conduction band.

The n-type barrier layer 3 has an energy level $E_{v3}$ (=$E_{vnb}$) greater than $E_{v2}$ at the top of the valence band, and has an energy level $E_{c3}$ (=$E_{cnb}$) less than $E_{c2}$ at the bottom of the conduction band.

The QW layer 4 has an energy level $E_{v4}$ (=$E_{va}$) greater than $E_{v3}$ at the top of the valence band, and has an energy level $E_{c4}$ (=$E_{ca}$) less than $E_{c3}$ at the bottom of the conduction band.

The p-type barrier layer 5 has an energy level $E_{v5}$ (=$E_{vpb}$) greater than $E_{v3}$ and less than $E_{v4}$ at the top of the valence band, and has an energy level $E_{c5}$ (=$E_{cpb}$) greater than $E_{c3}$ and $E_{c4}$ at the bottom of the conduction band.

The p-type cladding layer 6 has an energy level $E_{v6}$ less than $E_{v5}$ at the top of the valence band, and has an energy level $E_{c6}$ greater than $E_{c5}$ at the bottom of the conduction band. The energy level $E_{v6}$ at the top of the valence band is equal to the energy level $E_{c2}$. The energy level $E_{c6}$ at the bottom of the conduction band is equal to the energy level $E_{c2}$.

Therefore, the energy levels $E_{v2}$, $E_{v3}$, $E_{v4}$, $E_{v5}$ and $E_{v6}$ satisfy the relationship of $E_{v4} > E_{v5} > E_{v3} > E_{v2} = E_{v6}$. The band offset between $E_{v3}$ and $E_{v4}$ is $\Delta E_{vn}$, i.e., $E_{v4} - E_{v3} = \Delta E_{vn}$. The band offset between $E_{v5}$ and $E_{v4}$ is $\Delta E_{vp}$, i.e., $E_{v4} - E_{v5} = \Delta E_{vp}$. The band offset $\Delta E_{vn}$ between $E_{v3}$ and $E_{v4}$ is greater than the band offset $\Delta E_{vp}$.

The energy levels $E_{c2}$, $E_{c3}$, $E_{c4}$, $E_{c5}$ and $E_{c6}$ satisfy the relationship of $E_{v4} < E_{v3} < E_{v5} < E_{v2} = E_{v6}$. The band offset between $E_{c3}$ and $E_{c4}$ is $\Delta E_{cn}$, i.e., $E_{v3} - E_{v4} = \Delta E_{cn}$. The band offset between $E_{c5}$ and $E_{c4}$ is $\Delta E_{cp}$, i.e., $E_{c5} - E_{c4} = \Delta E_{cp}$. The band offset $\Delta E_{cn}$ between $E_{v3}$ and $E_{v4}$ is less than the band offset $\Delta E_{cp}$.

The n- and p-type cladding layers 3 and 6 have the same energy band gap of 2.8 V and the same refractive index less than those of the n- and p-type barrier layers 3 and 4.

Since the QW layer 4 is strained, the energy level $E_{v4}$ at the top of the valence band of the strained QW layer 4 is greater than the case of the QW layer with no strain, and the energy level $E_{c4}$ at the bottom of the conduction band thereof is less than the case of the strainless QW layer.

As seen from FIG. 2, the n- and p-type barrier layers 3 have the energy band lineup of the type 2 (i.e., the staggered type). However, the n-type cladding layer 2 and the n-type barrier layer 3 have the energy band lineup of the type 1 (i.e., the straddling type). Similarly, the p-type cladding layer 6 and the p-type barrier layer 5 also have the energy band lineup of the type 1.

The band offset $\Delta E_{vn}$ is greater than the band offset $\Delta E_{vp}$ by 60 meV, i.e., $\Delta E_{vn} - \Delta E_{vp} = 60$ meV. The band offset $\Delta E_{cp}$ is greater than the band offset $\Delta E_{cn}$ by 80 meV, i.e., $\Delta E_{cn} - \Delta E_{cp} = 80$ meV, which is greater than the band offset between $\Delta E_{vp}$ and $\Delta E_{vn}$.

As described above, with the II-VI compound semiconductor laser diode according to the first embodiment, when an injection current is supplied to the diode through the p- and n-side electrodes 9 and 10, holes are injected into the QW layer 4 through the p-type barrier layer 5 and at the same time, electrons are injected into the QW layer 4 through the n-type barrier layer 3.

Since the band offset $\Delta E_{vp}$ between the p-type barrier layer 5 and the QW layer 4 is low, the holes can be readily injected into the QW layer 4. On the other hand, the band offset $\Delta E_{vn}$ between the n-type barrier layer 3 and the QW layer 4 is high and therefore, the holes are difficult to diffuse into the n-barrier layer 3. Accordingly, the injected holes into the QW layer 4 can be accumulated and confined effectively within the layer 4.

Similarly, since the band offset $\Delta E_{cp}$ between the n-type barrier layer 3 and the QW layer 4 is low, the electrons can be readily injected into the QW layer 4. On the other hand, the band offset $\Delta E_{cn}$ between the p-type barrier layer 5 and the QW layer 4 is high and therefore, the electrons are difficult to diffuse into the p-barrier layer 5. Accordingly, the injected electrons into the QW layer 4 also can be accumulated and confined effectively within the layer 4.

The injected holes and electrons into the QW layer 4 are recombined with each other at a high recombination rate to emit light.

The n- and p-type cladding layers 2, 6 and 7 have the lower refractive index than that of the barrier layers 3 and 5 and the QW layer 4. Consequently, not only the electrons and holes but also the emitted light can be confined by the cladding layers 2, 6 and 7 within the strained QW structure composed of the QW layer 4 and the n- and p-type barrier layers 3 and 5. This means that the cladding layers 2, 6 and 7 enhance the confining effect to further decrease the threshold current.

The QW semiconductor laser diode according to the first embodiment can provide a low threshold current density for laser oscillation, for example, 300 A/cm$^2$ at room temperature. This means that the diode is capable of stable operation at room temperature.

SECOND EMBODIMENT

Figure 3:
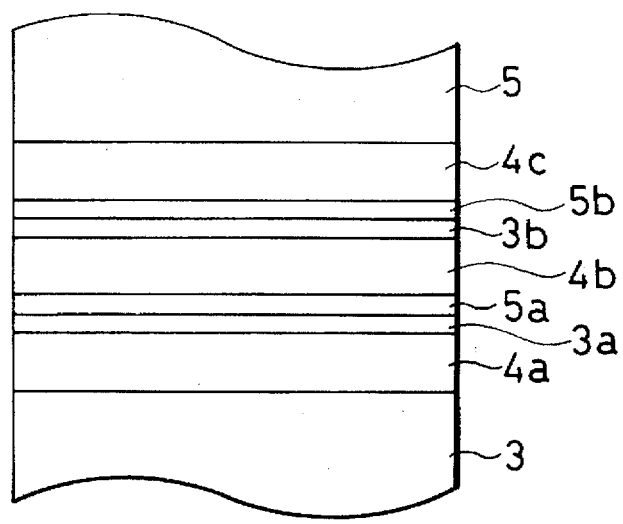
FIG. 3 is a schematic cross-section of a semiconductor light-emitting device according to a second embodiment of the invention.
Figure 4:
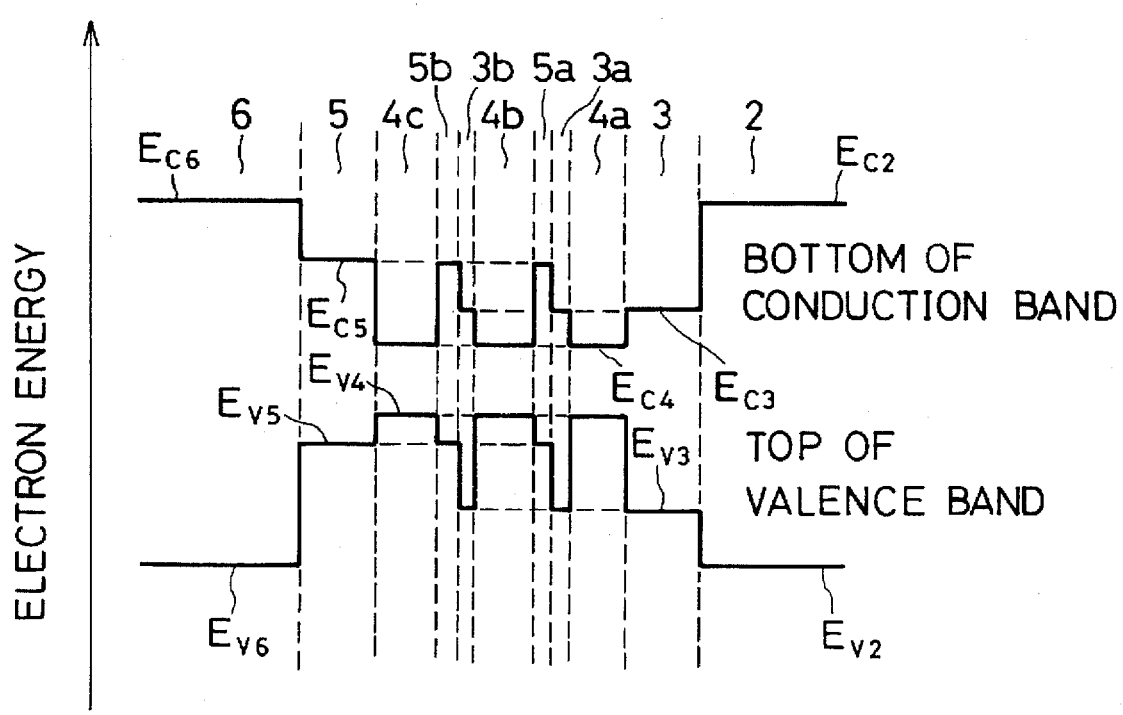
FIG. 4 is a partial energy band diagram of the semiconductor light-emitting device according to the second embodiment.

A II-VI compound semiconductor laser diode according to a second embodiment of the invention is shown in FIGS. 3 and 4, which is the same in structure as that of the first embodiment except that a multiple QW structure is provided instead of the single QW structure. Therefore, for the sake of simplification of description, an explanation relating to the same structure is omitted here and only the different structure is stated below by attaching the same reference numerals to the corresponding elements.

As shown in FIG. 3, between the n- and p-type barrier layers 3 and 5, the multiple QW structure is formed, which is composed of first, second and third QW layers 4a, 4b and 4c, first and third inner barrier layers 3a and 3b, and second and fourth inner barrier layers 5a and 5b.

Specifically, the first QW layer 4a with a thickness of 7 nm is formed on the n-type barrier layer 3. The first QW layer 4a is made of undoped $Zn_{0.8}Cd_{0.2}Se$. The first inner barrier layer 3a with a thickness of 1 nm is formed on the first QW layer 4a. The first inner barrier layer 3a is made of undoped $Zn_{0.9}Cd_{0.1}S_{0.22}Se_{0.78}$. The second inner barrier layer 5a with a thickness of 1 nm is formed on the first inner barrier layer 3a. The second inner barrier layer 5a is made of undoped $ZnS_{0.06}Se_{0.94}$.

The second QW layer 4b with the same configuration as that of the first QW layer 4a is formed on the second inner barrier layer 5a. The third inner barrier layer 3b with the same configuration as that of the first inner barrier layer 3a is formed on the second QW layer 4b. The fourth inner barrier layer 5b with the same configuration as that of the second inner barrier layer 5a is formed on the third inner barrier layer 3b.

The third QW layer 4c with the same configuration as that of the first QW layer 4a is formed on the fourth inner barrier layer 5a. The p-type barrier layer 5 is formed on the third QW layer 4c.

The II-VI compound semiconductor laser diode according to the second embodiment can be fabricated by the same process sequence except that each layer of the multiple QW structure is successively formed by an MBE method.

FIG. 4 shows the energy band diagram of the laser diode of FIG. 3. In FIG. 4, the first, second and third QW layers 3a, 3b and 3c have an energy level $E_{v4}$ at the top of the valence band, and has an energy level $E_{c4}$ at the bottom of the conduction band, where $E_{v4}>E_{v5}>E_{v3}>E_{v2}=E_{v6}$ and $E_{c4}<E_{c3}<E_{c5}<E_{c2}=E_{c6}$.

The first and third barrier layers 3a and 3c have an energy level equal to $E_{v3}$ of the n-type barrier layer 3 at the top of the valence band, and has an energy level equal to $E_{c3}$ of the n-type barrier layer 3 at the bottom of the conduction band.

The second and fourth barrier layers 5a and 5b have an energy level equal to $E_{v5}$ of the p-type barrier layer 5 at the top of the valence band, and has an energy level equal to $E_{c5}$ the barrier layer 5 at the bottom of the conduction band.

Similar to the first embodiment, in the valence band, the band offset between $E_{v3}$ and $E_{v4}$ is expressed as $\Delta E_{vn}=E_{v4}-E_{v3}$, and the band offset between $E_{v5}$ and $E_{v4}$ is expressed as $\Delta E_{vp}=E_{v4}-E_{v5}<\Delta E_{vn}$. In the conduction band, the band offset between $E_{c3}$ and $E_{c4}$ is expressed as $\Delta E_{cn}=E_{c3}-E_{c4}$, and the band offset between $E_{c5}$ and $E_{c4}$ is expressed as $\Delta E_{cp}=E_{c5}-E_{c4}>\Delta E_{cn}$.

As seen from FIG. 4, similar to the first embodiment, the n- and p-type barrier layers 3 and 5 have the energy band lineup of the 2. The n-type cladding layer 2 and the n-type barrier layer 3 have the energy band lineup of the type 1, and the p-type cladding layer 6 and the p-type barrier layer 5 also have the energy band lineup of the type 1.

With the II-VI compound semiconductor laser diode according to the second embodiment, when an injection current is supplied to the diode through the p- and n-side electrodes 9 and 10, holes are injected into the third QW layer 4c through the p-type barrier layer 5, into the second QW layer 4b through the fourth and third inner barrier layers 5b and 3b, and into the first QW layer 4a through the second and first inner barrier layers 5a and 3a. At the same time, electrons are injected into the first QW layer 4a through the n-type barrier layer 3, into the second QW layer 4b through the first and second inner barrier layers 3a and 5a, and into the third QW layer 4c through the third and fourth inner barrier layers 3b and 5b.

Since the band offset between the p-type barrier layer 5 and the third QW layer 4c is low, the holes can be readily injected into the third QW layer 4c. As the inner barrier layers 3a, 3b, 5a and 5b are very thin, holes can move from the QW layer 4c into the QW layers 4b and 4a. On the other hand, the band offset between the n-type barrier layer 3 and the first QW layer 4a is high. Therefore, the holes are difficult to diffuse into the n-type barrier layer 3, and as a result, the injected holes into the multiple QW layers 4a, 4b and 4c can be confined effectively within the layers 4a, 4b and 4c.

Since the band offset between the n-type barrier layer 2 and the first QW layer 4a is low, the electrons can be readily injected into the first QW layer 4a. As the inner barrier layers 3a, 3b, 5a and 5b are very thin, electrons can move from the QW layer 4a into the QW layers 4b and 4c. On the other hand, the band offset between the p-type barrier layer 5 and the third QW layer 4c is high. Therefore, the electrons are difficult to diffuse into the p-type barrier layer 5, and as a result, the injected electrons into the QW layers 4a, 4b and 4c can be confined effectively within the layers 4a, 4b and 4c.

Thus, the injected holes and electrons into the first, second and third QW layers 4a, 4b and 4c are recombined with each other at a high recombination rate, respectively.

The laser diode according to the second embodiment can provide a low threshold current density for laser oscillation, which is lower than that of the first embodiment.

THIRD EMBODIMENT

Figure 5:
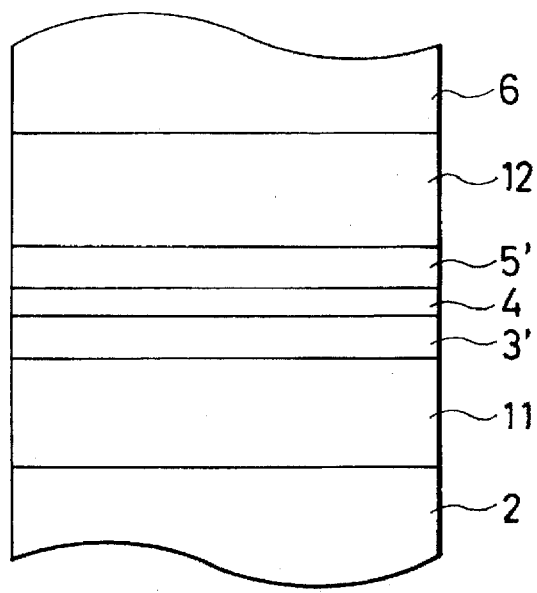
FIG. 5 is a schematic cross-section of a semiconductor light-emitting device according to a third embodiment of the invention.
Figure 6:
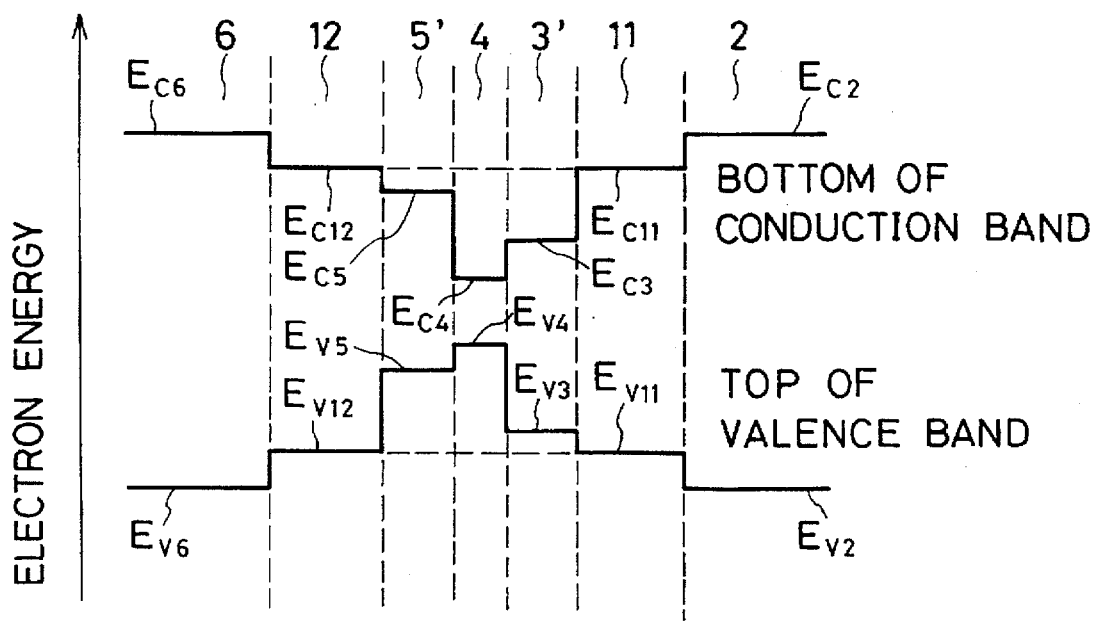
FIG. 6 is a partial energy band diagram of the semiconductor light-emitting device according to the third embodiment.

A II-VI compound semiconductor laser diode according to a third embodiment of the invention is shown in FIGS. 5 and 6, which is the same in structure as that of the first embodiment except that an n- and p-type optical guiding layers 11 and 12 are additionally provided and that n- and p-type barrier layers 3' and 5' have different thickness and polarity as those of the first embodiment. Therefore, only the different structure is stated below by attaching the same reference numerals to the corresponding elements for the sake of simplification of description.

As shown in FIG. 5, the n-type optical guiding layer 11 is formed between the n-type cladding layer 2 and a barrier layer 3', and the p-type optical guiding layer 12 is formed between the p-type cladding layer 6 and a barrier layer 5'.

The barrier layer 3' has a thickness of 10 nm, and is made of undoped $Zn_{0.9}Cd_{0.1}S_{0.22}Se_{0.78}$. The barrier layer 5' has a thickness of 10 nm, and is made of undoped $ZnS_{0.06}Se_{0.94}$.

The n-type optical guiding layer 11 has a thickness of 70 nm, and is made of n-type $Zn_{0.98}Mg_{0.02}S_{0.08}Se_{0.92}$ doped with Cl. The doping concentration of the layer 11 is $1\times10^{17}$ atoms/cm$^3$. The p-type optical guiding layer 12 has a thickness of 70 nm, and is made of p-type $Zn_{0.98}Mg_{0.02}S_{0.08}Se_{0.92}$ doped with N. The doping concentration of the layer 12 is $1\times10^{17}$ atoms/cm$^3$.

The II-VI compound semiconductor laser diode according to the third embodiment can be fabricated by the same process sequence as that of the first embodiment except that the formation processes of the n- and p-type optical guiding layers 11 and 12 are additionally necessary, which is carried out by an MBE method.

FIG. 6 shows the energy band diagram of the laser diode of FIG. 5. In FIG. 6, the n- and p-type optical guiding layers 11 and 12 have energy levels $E_{v11}$ and $E_{v12}$ equal to each other at the top of the valence band and energy levels $E_{c11}$ and $E_{c12}$ equal to each other at the bottom of the conduction band. The energy levels $E_{v11}$ and $E_{v12}$ satisfy the relationship as $E_{v4}>E_{v5}>E_{v3}>E_{v11=Ev12}>E_{v2}=E_{v6}$. The energy levels $E_{c11}$ and $E_{c12}$ satisfy the relationship as $E_{c4}<E_{c3}<E_{c5}<E_{c11}=E_{c12}<E_{c2}=E_{c6}$.

As seen from FIG. 6, similar to the first and second embodiments, the barrier layers 3' and 5' have the energy band lineup of the type 2. The n-type cladding layer 2 and the barrier layer 3' have the energy band lineup of the type 1, and the p-type cladding layer 6 and the barrier layer 5' also have the energy band lineup of the type 1.

With the II-VI compound semiconductor laser diode according to the third embodiment, when an injection current is supplied to the diode through the p- and n-side electrodes 9 and 10, holes are injected into the QW layer 4 through the barrier layer 5' and at the same time, electrons are injected into the QW layer 4 through the barrier layer 3'. Because of the same reason, the injected holes and electrons injected into the QW layer 4 can be accumulated and confined effectively within the layer 4.

FOURTH EMBODIMENT

Figure 7:
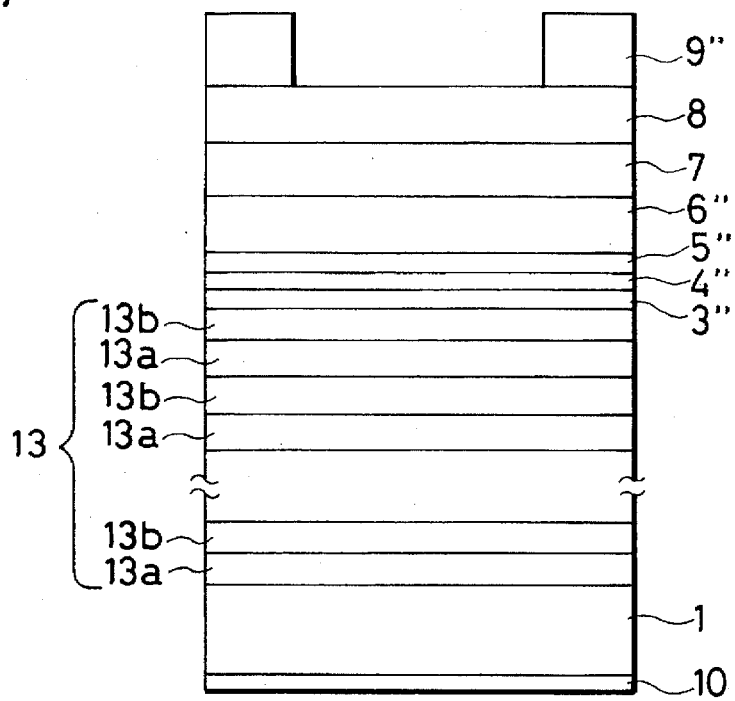
FIG. 7 is a schematic cross-section of a semiconductor light-emitting device according to a fourth embodiment of the invention.
Figure 8:
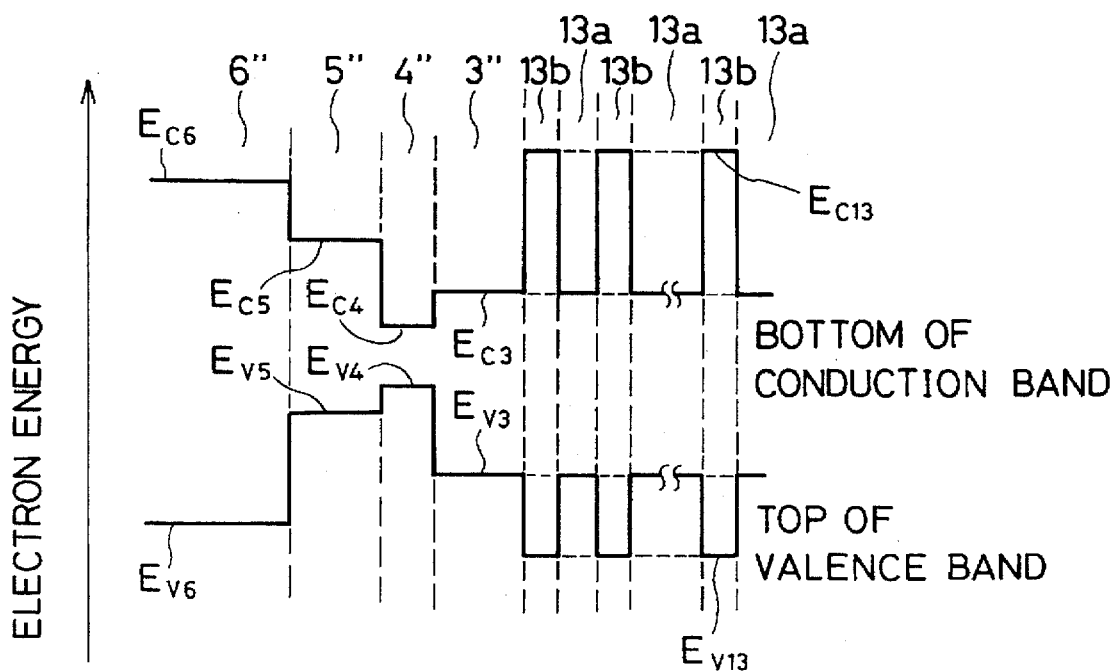
FIG. 8 is a partial energy band diagram of the semiconductor light-emitting device according to the fourth embodiment.

A II-VI compound semiconductor light-emitting diode according to a fourth embodiment of the invention is shown in FIGS. 7 and 8, which is the same in structure as that of the first embodiment except that an n-type reflection layer 13 is provided instead of the n-type cladding layer 2 and a p-side electrode 9" has a window for emitting the light, and that the QW layer 4" and the n- and p-type barrier layers 3" and 5" have different thickness from that of the first embodiment. Therefore, only the different structure is stated below by attaching the same reference numerals to the corresponding elements.

As shown in FIG. 7, the n-type reflection layer 13 is formed between the substrate 1 and the n-type barrier layer 3". The layer 13 is composed of ten first sublayers 13a and ten second sublayers 13b alternately arranged perpendicular to the substrate 1. The layer 13 can reflect the light from the QW layer 4" to the window in the p-side electrode 9" and increase the light output.

Each of the first sublayers 13a has a thickness of 61 nm, and is made of n-type $ZnS_{0.06}Se_{0.94}$ doped with Cl. The doping concentration of the sublayer 13a is $1 \times 10^{18}$ atoms/cm$^3$. Each of the n-type second sublayers 13b has a thickness of 68 nm, and is made of n-type $Zn_{0.75}Mg_{0.25}S_{0.42}Se_{0.58}$ doped with Cl. The doping concentration of the layer 13b is $1 \times 10^{18}$ atoms/cm$^3$.

The QW layer 4" has a thickness of 7 nm. The n- and p-type barrier layers 3" and 5" have the same thickness of 30 nm. The p-type cladding layer 6" has a thickness of 100 nm.

The II–VI compound semiconductor light-emitting diode according to the fourth embodiment can be fabricated by the substantially same process sequence as that of the first embodiment except that the formation process of the reflection layer 13 is additionally required.

FIG. 8 shows the energy band diagram of the light-emitting diode of FIG. 7. In FIG. 8, each of the first sublayers 13b has an energy level $E_{v13}$ at the top of the valence band and an energy level $E_{c13}$ at the bottom of the conduction band. The energy level $E_{v13}$ is less than $E_{v6}$ of the cladding layer 6". The energy level $E_{c13}$ is greater than $E_{c6}$ of the cladding layer 6".

With the II–VI compound semiconductor light-emitting diode according to the fourth embodiment, when an injection current is supplied to the diode through the p- and n-side electrodes 9" and 10, holes are injected into the QW layer 4" through the p-type barrier layer 5" and at the same time, electrons are injected into the QW layer 4" through the n-type barrier layer 3".

Because of the same reason as stated in the first embodiment, the injected holes and electrons injected into the QW layer 4" can be accumulated and confined effectively within the layer 4".

In the above first to fourth embodiments, the p- and n-barrier layers are made of a mixed crystal $Zn_xCd_{1-x}S_ySe_{1-y}$ and the p- and n- cladding layers are made of a mixed crystal $Zn_xMg_{1-x}S_ySe_{1-y}$. However, any other semiconductor material such as $Zn_xCd_{1-x}Se_yTe_{1-y}$, $Zn_xMg_{1-x}Cd_ySe_{1-y}$ and $Zn_xMg_{1-x}Se_yTe_{1-y}$ may be used.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. In a semiconductor light-emitting device including a quantum well layer and p- and n-barrier layers placed at each side of said quantum well layer;

said device comprising:

said quantum well layer having an energy level $E_{va}$ at the top of the valence band and an energy level $E_{ca}$ at the bottom of the conduction band;

said p-barrier layer having an energy level $E_{vpb}$ at the top of the valence band and an energy level $E_{cpb}$ at the bottom of the conduction band;

said n-barrier layer having an energy level $E_{vnb}$ at the top of the valence band and an energy level $E_{cnb}$ at the bottom of the conduction band;

said energy levels $E_{va}$, $E_{vpb}$ and $E_{vnb}$ at the top of the valence band satisfying a relationship of $E_{va} > E_{vpb} > E_{vnb}$; and said energy levels $E_{ca}$, $E_{cpb}$ and $E_{cnb}$ at the bottom of the conduction band satisfying a relationship of $E_{ca} < E_{cnb} < E_{cpb}$;

wherein electrons are injected into the quantum well layer through the n-barrier layer and holes are injected into the quantum well layer through the p-barrier layer;

and wherein said electrons and holes injected into said quantum well layer are recombined with each other to emit light from said active layer.

2. The device as claimed in claim 1, further comprising a p-cladding layer placed on a side of said p-barrier layer and an n-cladding layer placed on a side of said n-barrier layer;

wherein said p-cladding layer has an energy level at the top of the valence band less than that of said p-barrier layer and has an energy level at the bottom of the conduction band greater than that of said p-barrier layer;

and wherein said n-cladding layer has an energy level at the top of the valence band less than that of said n-barrier layer and has an energy level at the bottom of the conduction band greater than that of said n-barrier layer.

3. The device as claimed in claim 1, further comprising a p-guiding layer placed on the side of said p-barrier layer and an n-guiding layer placed on the side of said n-barrier layer;

wherein said p- and n-guiding layers have reflective indexes larger than those of said p- and n-cladding layers.

4. The device as claimed in claim 1, further comprising a reflection layer placed on a side of said p- or n-barrier layer to reflect said light produced in said quantum well layer.

5. The device as claimed in claim 1, wherein said quantum well layer is made of ZnCdSe;

and wherein one of said p- and n-barrier layers is made of ZnSSe and the other is made of ZnCdSSe;

and wherein said p- and n-cladding layers are made of ZnMgSSe.

6. In a semiconductor light-emitting device having a multiple quantum well structure, said multiple quantum well structure including quantum well layers, at least one inner barrier layer placed between said adjacent quantum well layers, a p-barrier layer placed to be contact with a p-side-end one of said quantum well layers, and an n-barrier layer placed to be contact with an n-side-end one of said quantum well layers;

said device comprising:

each of said quantum well layers having an energy level $E_{va}$ at the top of the valence band and an energy level $E_{ca}$ at the bottom of the conduction band;

said p-barrier layer having an energy level $E_{vpb}$ at the top of the valence band and an energy level $E_{cpb}$ at the bottom of the conduction band;

said n-barrier layer having an energy level $E_{vnb}$ at the top of the valence band and an energy level $E_{cnb}$ at the bottom of the conduction band;

said at least one inner barrier layer having an energy level $E_{vib}$ at the top of the valence band and an energy level $E_{cib}$ at the bottom of the conduction band;

said energy levels $E_{va}$, $E_{vpb}$, $E_{vnb}$ and $E_{vib}$ at the top of the valence band satisfying relationships of $E_{va} > E_{vpb} > E_{vnb}$ and $E_{va} > E_{vib}$;

said energy levels $E_{ca}$, $E_{cpb}$, $E_{cnb}$ and $E_{cib}$ at the bottom of the conduction band satisfying relationships of $E_{ca} < E_{cnb} <$ and $E_{ca} < E_{cib}$;

wherein electrons are injected into said n-side-end one of said quantum well layers through said n-barrier layer and said injected electrons are further injected into said remaining quantum well layers;

and wherein holes are injected into said p-side-end one of said quantum well layers through said p-barrier layer and said injected holes are further injected into said remaining quantum well layers;

and wherein said electrons and holes injected into said respective quantum well layers are recombined with each other to emit light from said quantum well layers.

7. The device as claimed in claim 6, further comprising a p-guiding layer placed on the side of said p-barrier layer and an n-guiding layer placed on the side of said n-barrier layer; wherein said p- and n-guiding layers have reflection indexes larger than those of said p- and n-cladding layers.

8. The device as claimed in claim 6, wherein said at least one inner barrier layer is made of a first sublayer and a second sublayer;

and wherein said first sublayer of said inner barrier layer has the same energy levels at the top of the valence band and at the bottom of the conduction band as those of said p-barrier layer;

and wherein said second sublayer of said inner barrier layer has the same energy levels at the top of the valence band and at the bottom of the conduction band as those of said n-barrier layer.

9. The device as claimed in claim 6, further comprising a reflection layer placed on a side of said p- or n-barrier layer to reflect said light produced in said quantum well layer.

10. The device as claimed in claim 6, wherein said quantum well layer is made of ZnCdSe;

and wherein one of said p- and n-barrier layers is made of ZnSSe and the other is made of ZnCdSSe;

and wherein said p- and n-cladding layers are made of ZnMgSSe.

* * * * *